(12) United States Patent
Grogan et al.

(10) Patent No.: US 9,196,457 B2
(45) Date of Patent: Nov. 24, 2015

(54) FLOW CELLS FOR ELECTRON MICROSCOPE IMAGING WITH MULTIPLE FLOW STREAMS

(75) Inventors: Joseph M Grogan, Philadelphia, PA (US); Haim H Bau, Swarthmore, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 0 days.

(21) Appl. No.: 13/478,413

(22) Filed: May 23, 2012

(65) Prior Publication Data

US 2012/0298883 A1    Nov. 29, 2012

Related U.S. Application Data

(60) Provisional application No. 61/489,405, filed on May 24, 2011.

(51) Int. Cl.
H01J 37/20    (2006.01)
H01J 37/28    (2006.01)

(52) U.S. Cl.
CPC ............ *H01J 37/28* (2013.01); *H01J 37/20* (2013.01); *H01J 2237/2003* (2013.01); *Y10T 156/10* (2015.01); *Y10T 156/1052* (2015.01)

(58) Field of Classification Search
CPC .......... H01J 37/16; H01J 37/20; H01J 37/26; H01J 37/261; H01J 37/28; H01J 37/295; H01J 37/2955; H01J 2237/2002; H01J 2237/2003; H01J 2237/2004; G21K 5/08

USPC .......................................... 250/440.11-443.1
See application file for complete search history.

(56) References Cited

U.S. PATENT DOCUMENTS

| | | | |
|---|---|---|---|
| 2004/0241042 A1* | 12/2004 | Pugia et al. .................... 422/58 |
| 2005/0047967 A1* | 3/2005 | Chuang et al. ................ 422/100 |
| 2007/0145289 A1* | 6/2007 | Chao et al. ............... 250/440.11 |
| 2008/0041151 A1* | 2/2008 | Fuertsch et al. ........... 73/204.16 |
| 2008/0179518 A1* | 7/2008 | Creemer et al. .............. 250/311 |
| 2008/0195020 A1* | 8/2008 | Cabuz et al. ................ 604/4.01 |
| 2009/0166536 A1* | 7/2009 | Suga et al. .................... 250/307 |
| 2009/0314644 A1* | 12/2009 | Golan et al. .................. 204/643 |
| 2010/0193398 A1* | 8/2010 | Marsh et al. .................. 206/710 |
| 2011/0006208 A1* | 1/2011 | Freitag et al. ................ 250/307 |
| 2012/0120226 A1 | 5/2012 | de Jonge |

OTHER PUBLICATIONS

Ring et al., "Microfluidic System for Transmission Electron Microscopy", Microscopy and Microanalysis 16, 622-629, 2010.*
Ring et al, "Microfluidic System for Transmission Electron Microscopy", Microscopy and Microanalysis 16, 622-629, 2010.*

(Continued)

*Primary Examiner* — Jack Berman
*Assistant Examiner* — David E Smith
(74) *Attorney, Agent, or Firm* — Baker & Hostetler LLP

(57) ABSTRACT

Provided are flow cell devices—referred to as nanoaquariums—that are microfabricated devices featuring a sample chamber having a controllable height in the range of nanometers to micrometers. The cells are sealed so as to withstand the vacuum environment of an electron microscope without fluid loss. The cells allow for the concurrent flow of multiple sample streams and may be equipped with electrodes, heaters, and thermistors for measurement and other analysis devices.

18 Claims, 11 Drawing Sheets

(56) References Cited

OTHER PUBLICATIONS

Ring et al, "Microfluidic System for Transmission Electron Microscopy", Microscopy and Microanalysis, 16, 622-629, 2010.*
Ring and de Jonge, "Microfluidic System for Transmission Electron Microscopy", Microscopy and Microanalysis, 16, 622-629, 2010.*
Grogan et al., "In situ liquid-cell electron microscopy of colloid aggregation and growth dynamics," Phys. Rev. E, Jun. 2011, 83(6), 061405-1-061405-5.
Grogan et al., "The Nanoaquarium: A Platform for In Situ Transmission Electron Microscopy in Liquid Media," Journal of Microelectromechanical Systems, Aug. 2010, 19(4), 885-894.
Grogan, J. M., "The nanoaquarium: A nanofluidic platform for in situ transmission electron microscopy in liquid media," Dissertation to the University of Pennsylvania Department of Mechanical Engineering and Applied Mathematics, Jan. 1, 2011, 198 pages.
Joo et al., "Fabrication of monolithic microchannels for IC chip cooling," Micro Electro Mechanical Systems, 1995, MEMS '95, Proceedings, IEEE, Jan. 29-Feb. 2, 1995, 362-367.

* cited by examiner

FLOW CELLS FOR ELECTRON MICROSCOPE IMAGING WITH MULTIPLE FLOW STREAMS

CROSS REFERENCE TO RELATED PATENT APPLICATION

The present application claims priority to U.S. Provisional Application No. 61/489,405, "Flow Cells for Electron Microscope Imaging with Multiple Flow Streams," filed on May 24, 2011, and incorporated herein by reference in its entirety for any and all purposes.

STATEMENT OF GOVERNMENT INTEREST

This invention was made with government support under grants CBET-0609062 and DMR-0425780, awarded by the National Science Foundation. The government has certain rights in the invention.

TECHNICAL FIELD

The present invention relates to the fields of microfabricated devices and to the field of electron microscopy.

BACKGROUND

The invention of the electron microscope has facilitated advances in scientific endeavors ranging from materials science to chemistry to biology to medicine. However, generally, the electron microscope may use a high vacuum environment and is not capable of imaging processes in real time in fluids such as water without significant modification. When studying liquid-borne processes, the current electron imaging technology is restricted to "postmortem," after the fact, investigations of dry or frozen samples. This is a slow, painstaking procedure without any guarantee that an image is captured at the "right" moment. Moreover, the preparation of the sample for observation may alter it in a fundamental way. Also, frozen images do not provide information on process dynamics. Although the environmental microscope permits the use of liquid samples, typically stability of the liquid sample can be a challenge and observations may be limited to processes taking place at the liquid's surface. An ability to image dynamic processes in liquid media in real time and to interact with the processes is certain to provide a better understanding of many nanoscale phenomena such as (1) nanoscale particle interactions; (2) colloidal crystals and formation of metamaterials with unique properties; (3) electrochemical deposition and etching; (4) processes associated with charging and discharging of batteries; (5) interfacial phenomena; (6) biological interactions; (7) conformational changes; and (8) protein and nanoparticle migration on lipid membranes. Better understanding of the physics involved in these diverse phenomena will doubtlessly lead to new processes and technologies.

SUMMARY

The general description and the following detailed description are exemplary and explanatory only and are not restrictive of the invention, as defined in the appended claims. Other aspects of the present invention will be apparent to those skilled in the art in view of the detailed description of the invention as provided herein.

In one embodiment, the present disclosure provides devices, the devices suitably including a chamber defined by upper and lower membranes; the chamber having a height in the range of from about 10 nm to about 50 μm; at least one inlet in fluid communication with the chamber; and at least one outlet in fluid communication with the chamber.

Also provided are methods, the methods suitably including depositing from about 10 nm to about 10 μm of a spacer material atop a bottom membrane material; processing the spacer material so as to define a chamber atop the bottom membrane material; and bonding a top membrane material to the spacer material so as to seal the chamber.

Further disclosed are fabrication methods, the fabrication methods suitably including coating a bottom membrane with a quantity of a sacrificial spacer material; coating the first sacrificial material with a top membrane material; forming one or more passages through the top membrane material so as to expose at least a portion of the sacrificial spacer material; etching away at least a portion of the sacrificial spacer material so as to form a space between the bottom membrane and top membrane; and sealing at least one of the passages.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

Figure 1:
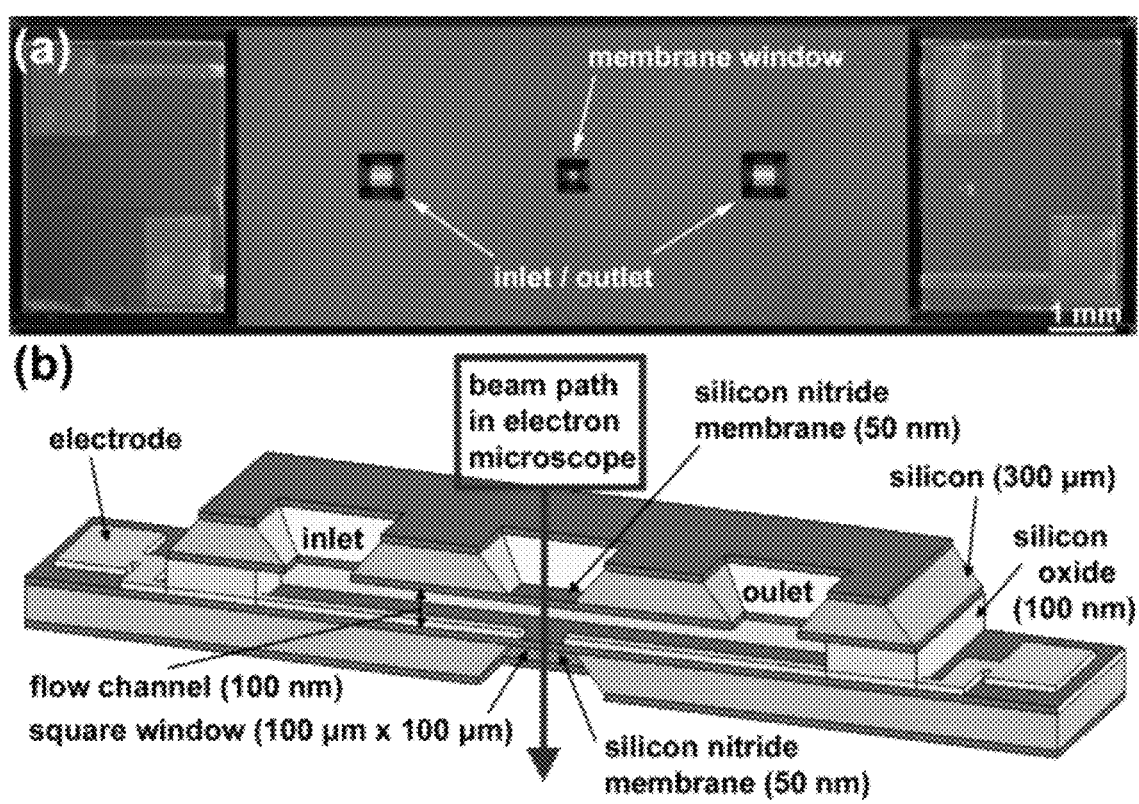
FIG. 1 illustrates a top view photo and a cross-section graphic of the nanoaquarium. The flow cell is about 100 nm tall and sandwiched between two 50 nm thick silicon nitride membranes. The device is transparent to electrons.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable. All documents mentioned herein are incorporated by their entireties for any and all purposes.

It should be understood that the terms "top" and "bottom" are used solely for cross reference between the text and the figures and that, in the actual device, the top and bottom are interchangeable. For example, certain described embodiments disclose a conductive material disposed on a bottom membrane. Such conductive material, however, could be deposited on the top membrane without changing the function of the device. In certain applications, of course, it may be desirable to deposit electrodes, metallic lines, or other conductive materials on both (top and bottom) membranes.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

In a first aspect, the present application provides devices. The devices include a chamber defined by upper and lower membranes, the chamber having a height in the range of from about 10 nm to about 100 µm; at least one inlet in fluid communication with the chamber; and at least one outlet in fluid communication with the chamber.

In some cases, the upper and lower membranes are surmounted, respectively, by upper and lower layers. These upper and lower layers can lend structural support to the membranes. The upper and lower layers are optional, as a device may have an upper layer supporting the upper membrane, a lower layer supporting the lower membrane, or both. Alternatively, membranes may be deposited directly onto the spacer material, without any support layers. The upper and lower layers may be silicon, as shown in the appended figures, although other material, such as polymers/plastics are suitable. A layer may have a thickness in the range of from about 50 nm to about 1 mm with preferred thickness of from about 200 µm to about 300 µm The upper and lower layers may themselves have apertures formed thereon. The apertures are suitably in register with at least a portion of the chamber and with one another. One such example is FIG. 1, which figure illustrates silicon layers above and below the SiN membranes that define a flow channel, the silicon layers having apertures formed therethrough. In some other cases, the membranes may be deposited directly on the spacer material.

The height of the chamber is suitably defined by the thickness of a spacer material disposed between the upper and lower membranes. Suitable spacer materials include silicon oxide, silicon nitride, silicon oxynitride, silicon, aluminum oxide, aluminum nitride, hafnium oxide, tantalum nitride, gold, platinum, silver, copper, aluminum, indium tin oxide, polymer photoresist, polymer epoxy, parylene, and the like. The spacer material suitably has a thickness in the range of from about 5 nm to about 10 micrometers, or from about 10 nm to about 1 micrometer, or from about 50 nm to about 500 nm.

Devices may also include one, two, or more electrodes disposed within the chamber. The electrodes may be deposited on the bottom surface and/or on the top surface. Devices may also include heaters, thermistors, and the like disposed within the chamber. FIG. 1 is illustrative, showing two electrodes present within the device's flow chamber. An electrode may be adapted so as to dielectrophoretically trap particles. In one exemplary embodiment, an electrode is used to trap particles so that the particles may be positioned within the chamber and further analyzed.

A device may also include one or more fluid storage reservoirs capable of fluid communication with the chamber. The fluid reservoirs may be connected to an inlet or outlet of the device. The fluid storage reservoir may also be in fluid communication with a gas reservoir. The gas reservoir may be either in the chip or in the chip holder. Fluid and gas storage reservoirs are configured such that expansion of gas in the gas storage reservoir displaces fluid from the fluid storage reservoir. The liquid or fluid in the storage reservoir may be stored on a chip or cartridge. The gas storage reservoir (e.g., filled with air) may be disposed on a holder or base that engaged with the cartridge. Gas expansion may be achieved by heating. Alternatively, gas (e.g., air) may be compressed by deflecting a membrane. The gas may be transmitted directly into the observation chamber to form gas-liquid interface to enable observations of processes taking place at liquid-gas interface and processes driven by evaporation. The device differs from other liquid cells in incorporating liquid storage and means to pump the liquids within the device. Typically, liquid storage and pumping are accommodated outside the vacuum chamber of the microscope, requiring a sample holder with hydraulic passages. Fluid displacement may be effected by a chemical or electrochemical reaction. As one example, the membrane may be deflected by evolution of gas from a chemical or electrochemical reaction. As another example, the membrane may be deflected by a membrane that is piezoelectrically actuated.

The devices may include other components. For example, the devices may include a pump that is in fluid communication with the chamber. In such embodiments, the pump may be used to exert fluid into the chamber or even to remove fluid from the chamber. The devices may also include a storage vessel (e.g., a reservoir, chamber, vial, and the like) that is in fluid communication with the chamber. Such storage vessels may be used to contain sample, reagents, washes, and the like for introduction to the chamber.

Figure 11:
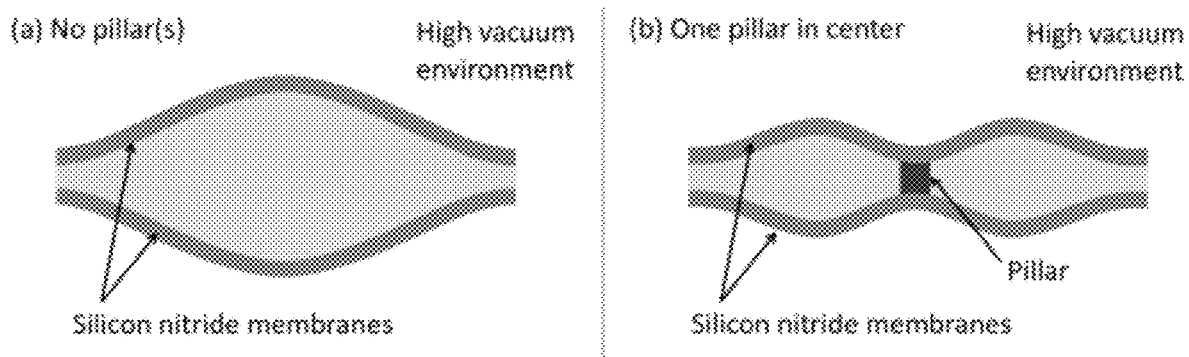
FIG. 11: An illustrative image of an imaging chamber featuring pillars that connect a lower membrane to an upper membrane to minimize membrane deflection.

One situation presented by some liquid cells is that when the liquid cell is inserted into the vacuum chamber of the electron microscope, the pressure difference between the inside and outside of the liquid cell causes a significant deformation of the membranes, effectively increases the thickness of the liquid layer, sometimes many fold. Increased thickness of the liquid leads to increased scattering of electrons by the suspending medium and reduced resolution. In an optional embodiment of the device, the device may include one or more pillars connecting between the upper and lower membranes. These pillars may act to strengthen or stiffen the membranes so as to reduce membrane deflection as illustrated in FIG. 11. A pillar may have a cross-sectional dimension (e.g., width or diameter) in the range of from about 0.1 micrometer to about 10 micrometers, or in the range of from about 10 micrometers to about 50 micrometers.

Membranes may be fabricated from materials that are transparent to electrons. Silicon nitride is considered especially suitable; silicon oxide, silicon oxynitride, carbon, graphene, polymers, and the like are also suitable. Membranes may have a thickness in the range of from about 5 nm to about 100 nm, or from about 20 nm to about 50 nm.

An aperture of the device may have a cross-sectional dimension in the range of from about 50 nm to about 1 millimeter, or even from about 100 nm to about 1 micrometer, or even from about 500 nm to about 750 nm.

Figure 7:
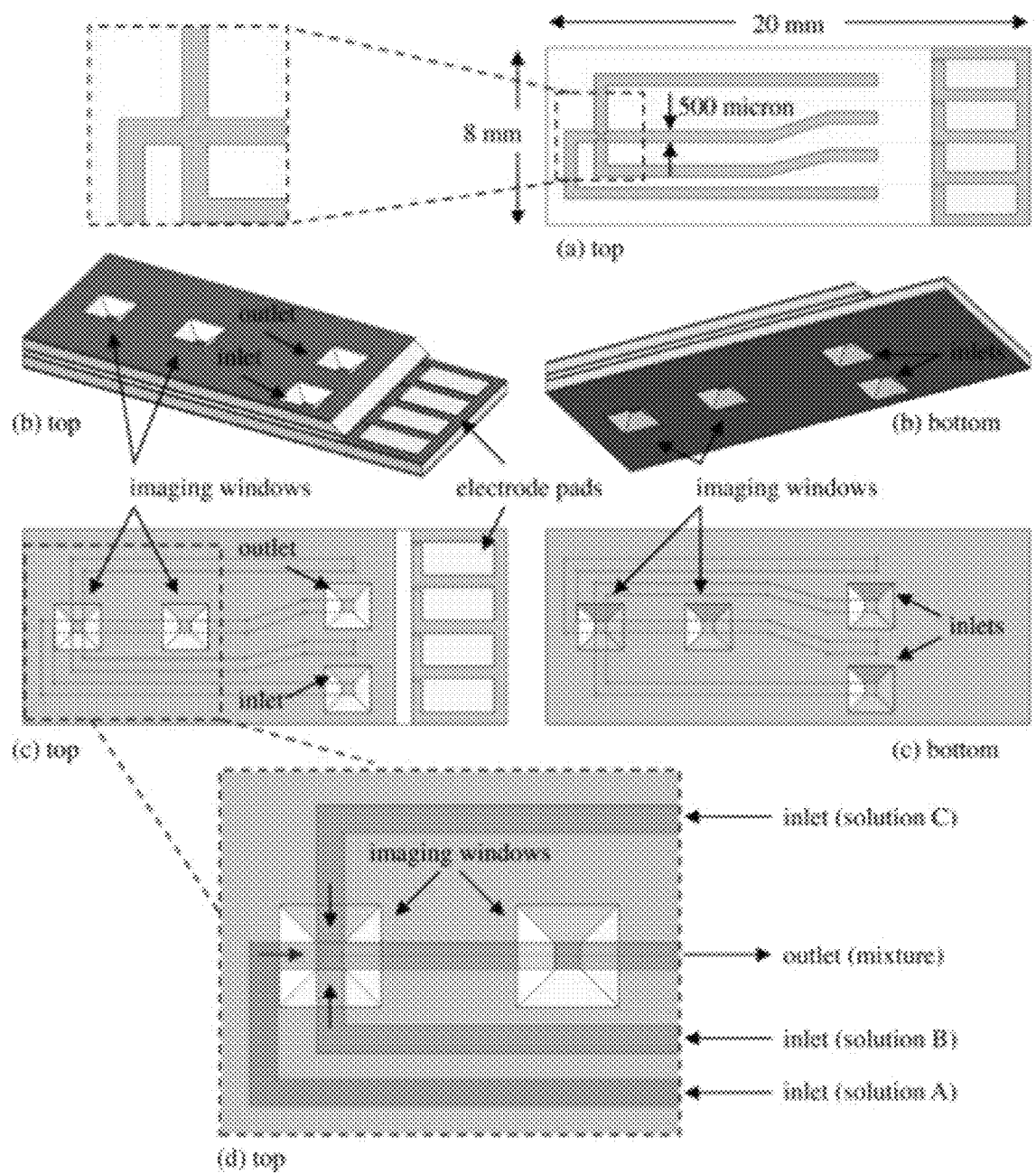
FIG. 7: Illustration of a four port version of an exemplary nanoaquarium. (a) Top view of the oxide pattern with four channels that intersect at a cross. Electrodes/resistors are patterned at the intersection to induce (when desired) electric fields and to control and monitor the chamber's temperature. (b) Top and bottom isometric views of the final device. (c) Top and bottom views of the final device with gray lines outlining the channel pattern buried inside the chip. (d) Zoomed in view of a final device with colored streams illustrating one possible flow path in the enclosed channels for up to three different solutions. Multiple streams meet at the intersection, mix, and flow to the outlet. Multiple viewing windows make it possible to image the mixture at various positions when operating at optional continuous flow mode. Other flow patterns are also possible.

As shown in FIG. 7, the device may be constructed such that two or more conduits converge. This allows the user to mix two or more fluid streams and image streams individually or even after the streams have combined, as shown in FIG. 7.

Systems may be constructed that include one, two, three, or even more of the disclosed devices. These devices may reside on a single substrate. Multiple devices may draw on the same source of sample or reagent or may have their own, independent sources of sample or reagent.

Also disclosed are methods. The disclosed methods include depositing from about 10 nm to about 10 μm of a spacer material atop a bottom membrane material; processing the spacer material so as to define a chamber atop the bottom membrane material; and bonding a top membrane material to the spacer material so as to seal the chamber.

In some embodiments, the methods include depositing an amount (e.g., from about 10 nm to about 10 micrometers) of a sacrificial spacer material atop a bottom membrane material; processing the spacer material to define chambers, conduits, and optional pillars atop the bottom membrane material; depositing a top membrane material that conformally coats the sacrificial spacer material; opening access holes in the top membrane; etching the spacer material to form a hollow channel between the top and bottom membrane layers; and depositing a layer of material to seal the access holes in the top membrane so as to seal the chamber.

Methods may include depositing an electrically conductive material atop the bottom membrane material and/or under the top membrane material so as to define one or more conductive regions, such as electrodes. The spacer material may be processed so as to expose at least a portion of the at least one or more conductive regions. The exposed portion of the one or more conductive regions may be disposed within the chamber. In some embodiments, the conductive material conducts heat, but is not exposed in the chamber. In such an embodiment, the conductive material is disposed beneath a material like silicon oxide or silicon nitride and is not exposed to the interior of the chamber. The exposed or unexposed patterned metallic layers can serve as electrodes and actuators. The actuators can induce DC and AC electric fields and facilitate dielectrophoretic trapping.

Processing the spacer material further comprises processing the spacer material so as to give rise to one or more pillars extending between the bottom and top membranes. The user may also bond a bottom support material to the bottom membrane, bonding a top support material to the top membrane, or both. Users may also form one or more apertures in the bottom support material, the top support material, or both; an aperture is suitably (as shown in FIG. 1) in register with the chamber. Apertures also suitably extends through the top membrane or through the bottom membrane, and may also extend to a conduit capable of fluid communication with the chamber. The user may also process the spacer material so as to define one or more fluid conduits in fluid communication with the chamber.

Figure 8:
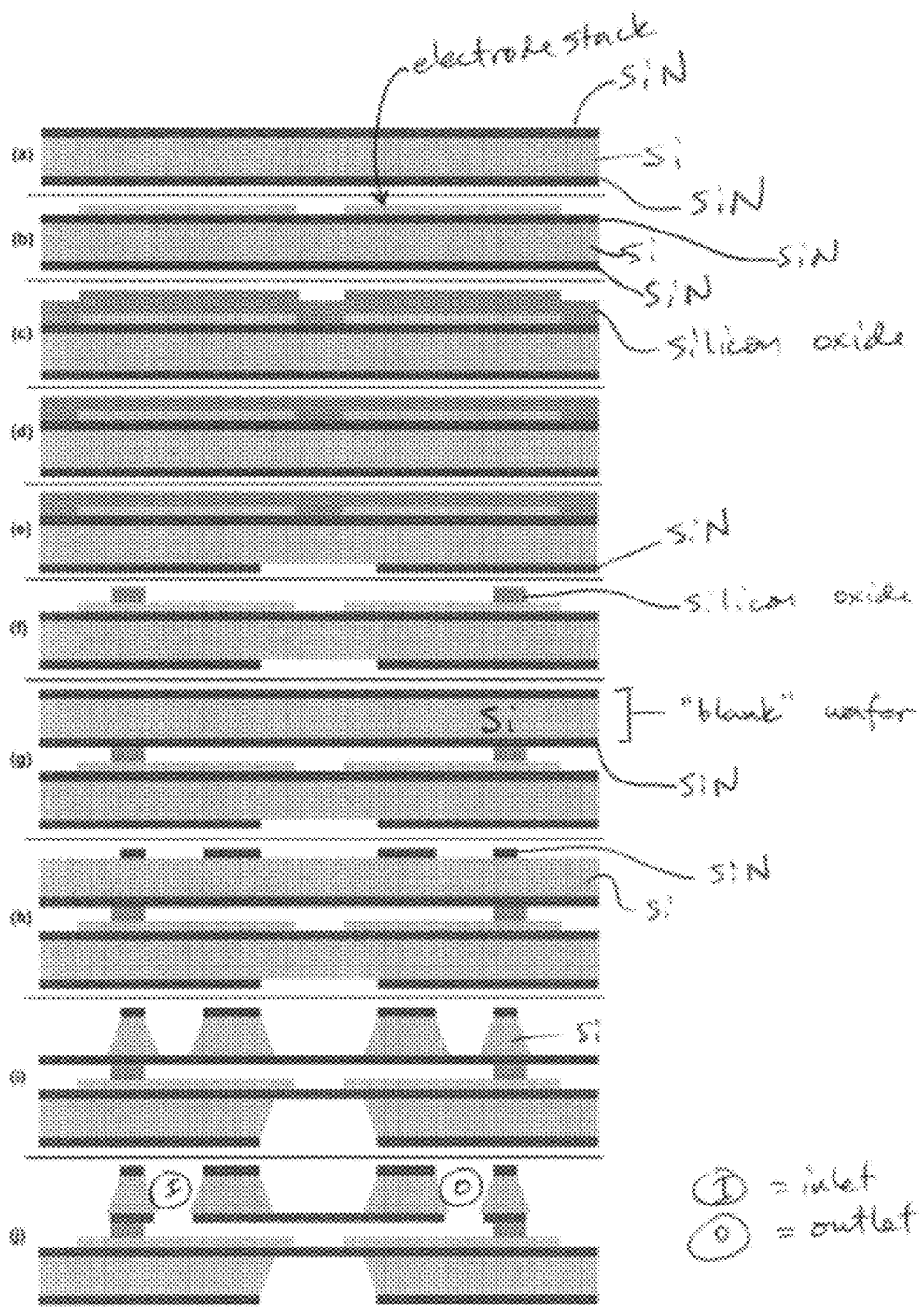
FIG. 8: Depiction of various, non-limiting fabrication steps. (a) 50-nm silicon nitride is deposited by low pressure chemical vapor deposition. (b) 30-nm Ti/Pt/Ti electrode stack deposited and patterned by evaporation and liftoff (c) 150-nm silicon oxide deposited by plasma enhanced chemical vapor deposition. (d) Oxide planarization in a chemical mechanical polisher. (e) Backside nitride patterned in reactive ion etcher. (f) Frontside oxide patterned with buffered oxide etch. (g) Plasma-activated wafer bonding to a blank nitride-coated wafer. (h) Backside nitride on the top wafer patterned in reactive ion etcher. (i) Windows and vias etched with potassium hydroxide. (j) Inlet, outlet, and electrodes are exposed.

An exemplary fabrication is shown in FIG. 8. As shown in that figure, (a) 50-nm silicon nitride deposited by low pressure chemical vapor deposition. (b) 30-nm Ti/Pt/Ti electrode stack deposited and patterned by evaporation and liftoff (c) 150-nm silicon oxide deposited by plasma enhanced chemical vapor deposition. (d) Oxide planarization in a chemical mechanical polisher. (e) Backside nitride patterned in reactive ion etcher. (f) Frontside oxide patterned with buffered oxide etch. (g) Plasma-activated wafer bonding to a blank nitride-coated wafer. (h) Backside nitride on the top wafer patterned in reactive ion etcher. (i) Windows and vias etched with potassium hydroxide. (j) Inlet, outlet, and electrodes are exposed.

Figure 10:
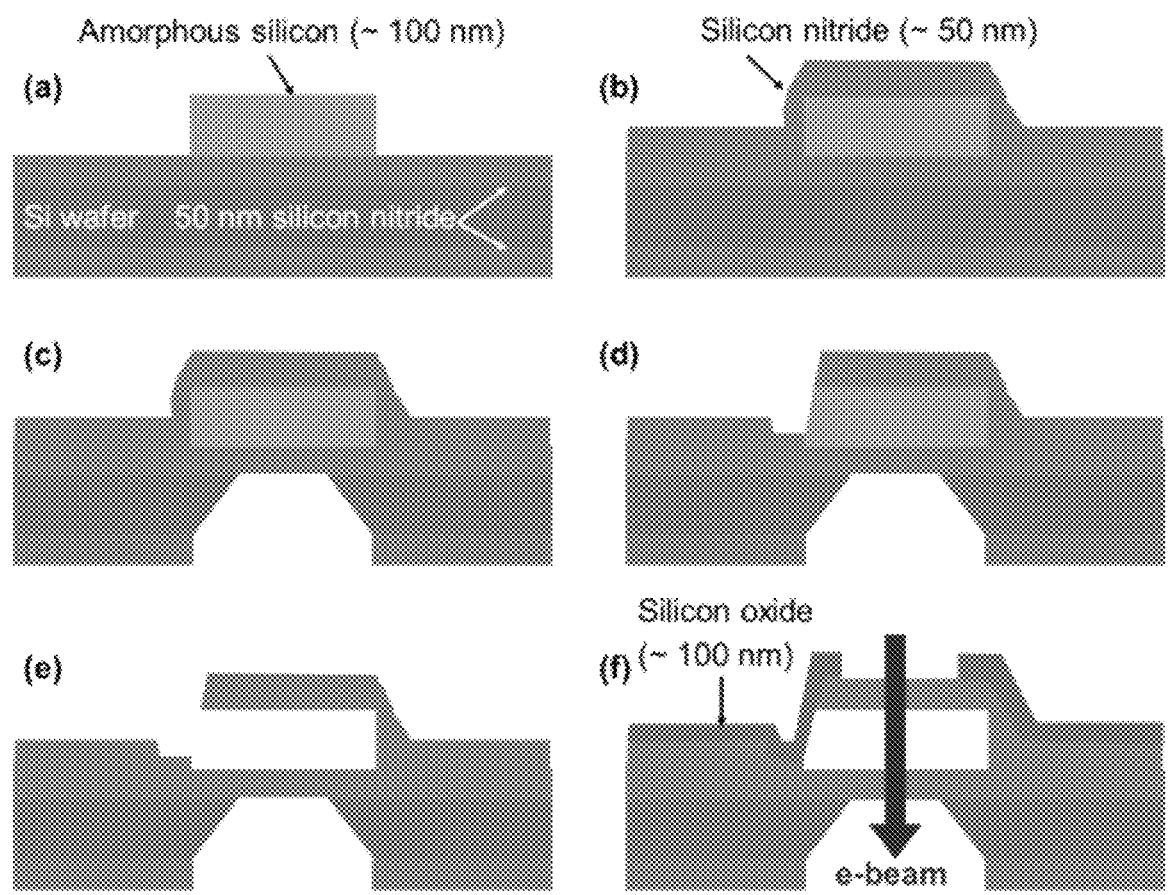
FIG. 10: Cross-sectional illustration of alternative fabrication technique that does not require wafer bonding. The image illustrates the fabrication steps. The images are not drawn to scale and not all features are depicted. (a) Deposition of amorphous silicon on a silicon nitride coated wafer. (b) Deposition of conformal silicon nitride coating. (c) Patterning and etching of silicon wafer to form suspended membrane viewing window. (d) Etch silicon nitride film to gain access to amorphous silicon. (e) Xenon difluoride vapor phase etch of amorphous silicon to form nanochannel. (f) Deposition and patterning of silicon oxide film to seal channel.

Another exemplary method is shown in FIG. 10. As shown in exemplary FIG. 10, fabrication steps may include (a) deposition a sacrificial spacer (e.g., amorphous silicon) on a bottom membrane (e.g., silicon nitride-coated wafer). The methods may also include (b) deposition of a top membrane (e.g., conformal silicon nitride). The methods may further include patterning and etching of the bottom membrane so as to form a suspended membrane viewing window. The methods may further include etching the top membrane (e.g., to form a passage) so as to expose or otherwise gain access to the sacrificial spacer material. The user may etch the sacrificial spacer material (e.g., via xenon difluoride vapor phase etch of amorphous silicon) so as to remove the spacer, leaving behind a channel, pillar, or other structure between the top and bottom membranes. The user may then apply an additional material (e.g., silicon oxide, polymer) so as to seal the structure (e.g., channel) formed by removal of the sacrificial spacer material.

Additional Background and Discussion

The invention of the electron microscope has facilitated advances in scientific endeavors ranging from materials science to chemistry to biology to medicine. However, the electron microscope may use a high vacuum environment and is not capable of imaging processes in real time in fluids such as water. When studying liquid-borne processes, the current electron imaging technology is restricted mostly to "postmortem," after the fact, investigations of dry or frozen samples. This is a slow, painstaking procedure without any guarantee that an image is captured at the "right" moment. Moreover, the preparation of the sample for observation may alter it in a fundamental way. Also, frozen images do not provide information on process dynamics. An ability to image dynamic processes in liquid media in real time and to interact with the processes is certain to provide a better understanding of many nanoscale phenomena such as (1) nanoscale particle interactions; (2) colloidal crystals and formation of meta-materials with unique properties; (3) electrochemical deposition and etching; (4) processes associated with charging and discharging of batteries; (5) interfacial phenomena; (6) biological interactions; and (7) protein and nanoparticle migration on lipid membranes. Better understanding of the physics involved in these diverse phenomena will doubtlessly lead to new processes.

To enable real time imaging of dynamic, nanoscale processes in liquid media, disclosed is a nanofluidic platform for in-situ Transmission Electron Microscope (TEM) and Scanning Transmission Electron Microscope (STEM) imaging of phenomena taking place in fluids. This platform is referred to herein as the nanoaquarium, for the sake of convenience.

The nanoaquarium is a microfabricated, hermetically sealed flow cell, with a controllable height which can be as small as tens of nanometers or as big as a few micrometers, sandwiched between two thin silicon nitride membranes (FIG. 1). The flow cell is able to withstand the high vacuum environment of the electron microscope without any loss of liquid. The cell allows the concurrent flow of multiple streams. It is equipped with electrodes for actuation, sensing, and electro-chemical studies and will include heaters and thermistors for temperature measurement and control. Devices are fabricated through microfabrication, using batch processing technology to enable concurrent production of a large number of identical devices at a reasonable cost. It should be understood that the term "fluid" refers to liquids, suspensions, gases, and combinations thereof.

Due to its thin liquid layer and membranes, the nanoaquarium can be imaged with the relatively low voltage beam (<30 kV) of the scanning electron microscope with a STEM detector as well as the higher voltages typically used in transmission electron microscopy (≤300 kV).

The ability of the nanoaquarium to operate with the SEM/STEM makes it useful to a range of research groups equipped with SEM/STEM and TEM. Since the SEM/STEM has generous space, adapting it for the nanoaquarium is effected via a relatively simple and inexpensive fixture that is readily fabricated by any lab.

Figure 2:
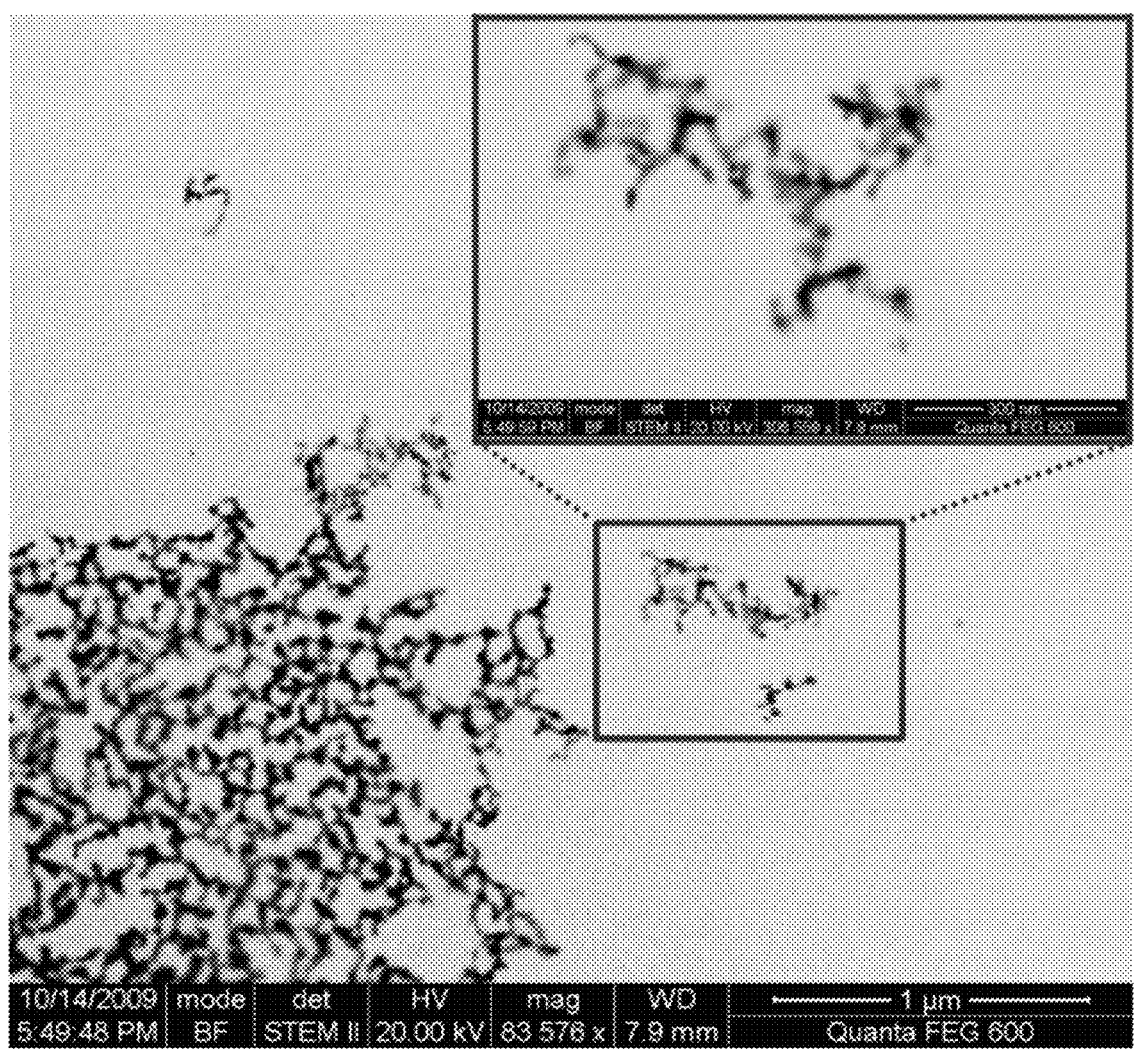
FIG. 2 illustrates a bright field STEM image of an aqueous solution containing 5 nm gold particles (20 kV). Insert is a zoomed image taken 10 seconds later showing aggregate evolution. Even better resolution can be obtained with the higher voltage beam of the TEM.
Figure 4:
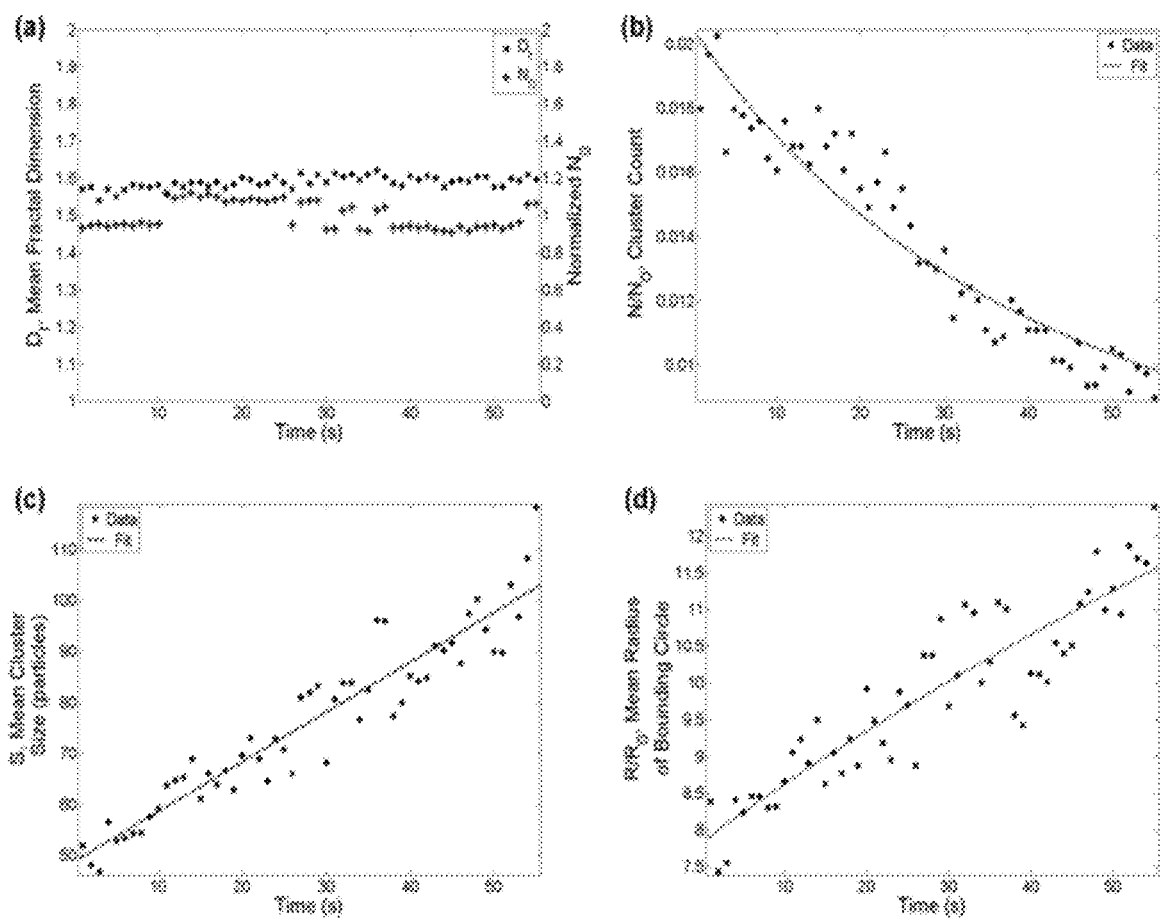
FIG. 4 illustrates an illustrative, non-limiting analysis of real-time, electron-imaging video of aggregating, amorphous 5 nm gold colloids. The symbols and lines correspond, respectively, to experimental data and least squares fits. (a) The mean fractal dimension $D_f$ and the number of primary particles $N_0$ as functions of time. The fractal dimension increases slowly with time, and eventually attains the asymptotic value of 1.77±0.10. (b) The number of clusters decreases as the inverse function of time (1/t). (c) The mean cluster size increases nearly linearly with time. (d) The mean cluster radius increases as $t^{1/D_f}$. The experimental results are in excellent agreement with theoretical predictions and previously published data for diffusion-limited aggregation.

An exemplary flow cell (nanoaquarium) of 100 nm height was sandwiched between two thin, silicon nitride membranes (FIG. 1). Since the fabrication technique relies on direct wafer bonding, one can produce perfectly sealed flow cells with cell heights smaller than had been achieved before. It was demonstrated that the devices facilitate in-situ, real time imaging of the motion and interactions of nanoparticles (FIG. 2). One can also monitor (not shown) the migration, rotation, and interactions of nanoparticles/nanorods. Dynamics of the diffusion-limited aggregation of 5 nm gold colloids were studied; e.g., J. M. Grogan, L. Rotkina, and H. H. Bau, "In situ liquid-cell electron microscopy of colloid aggregation and growth dynamics," Phys. Rev. E, vol. 83, no. 6, June 2011. FIG. 4 depicts various characteristics of the process, as obtained from the videos during the in-situ electron imaging of the aggregation process. In addition, electrochemical deposition and etching can be monitored in-situ.

Fabrication Details

Figure 5:
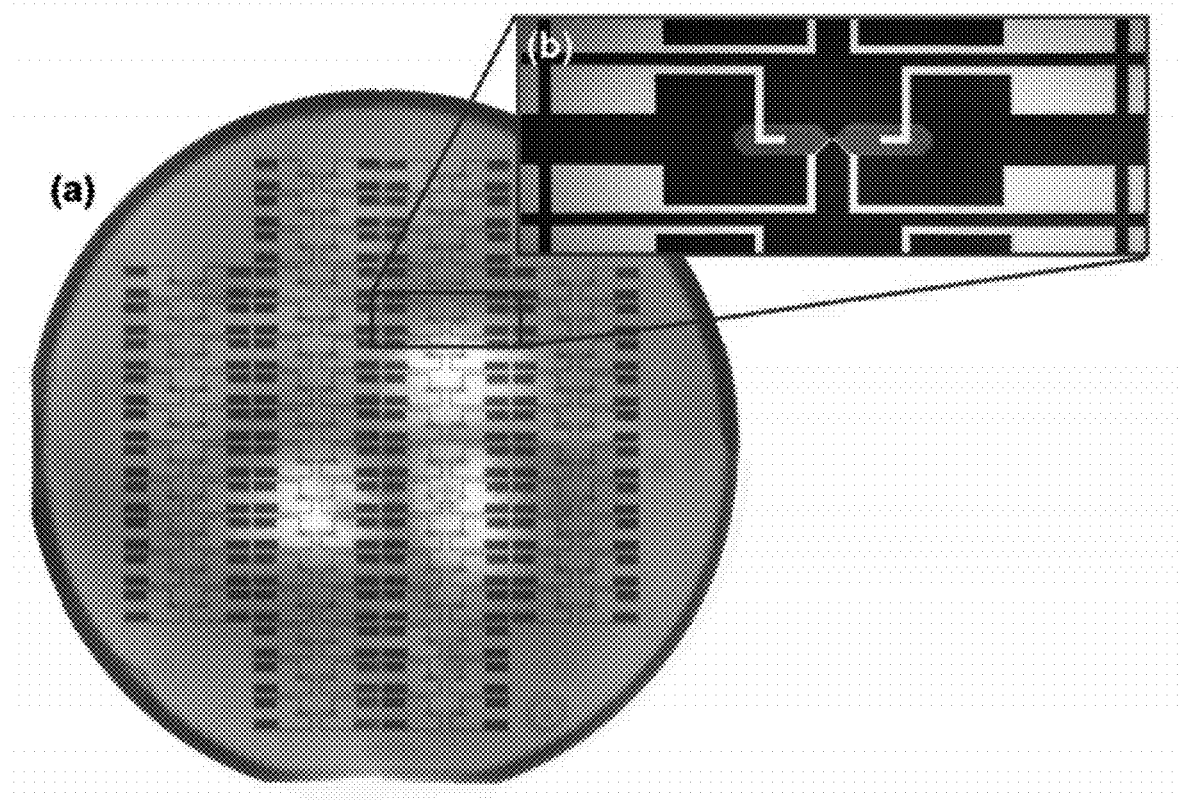
FIG. 5: An illustrative infrared image of a bonded pair of wafers with embedded nanoaquarium devices showing excellent void-free bonding. Each set of bonded wafers contains 52 devices. Insert is a photograph of the patterned bottom wafer prior to bonding.

Described here are illustrative, non-limiting fabrication processes and features incorporated in the nanoaquarium, as well as the sample holder. Both processes utilize batch, silicon-based micro/nano-fabrication techniques. In order to form a sealed chamber, one process relies on direct wafer bonding and the other process relies on removal of a sacrificial layer in a lamellar structure. Hundreds or thousands of identical units can be fabricated in a single run. For example, FIG. 5 shows a wafer with multiple devices patterned on it.

Figure 3:
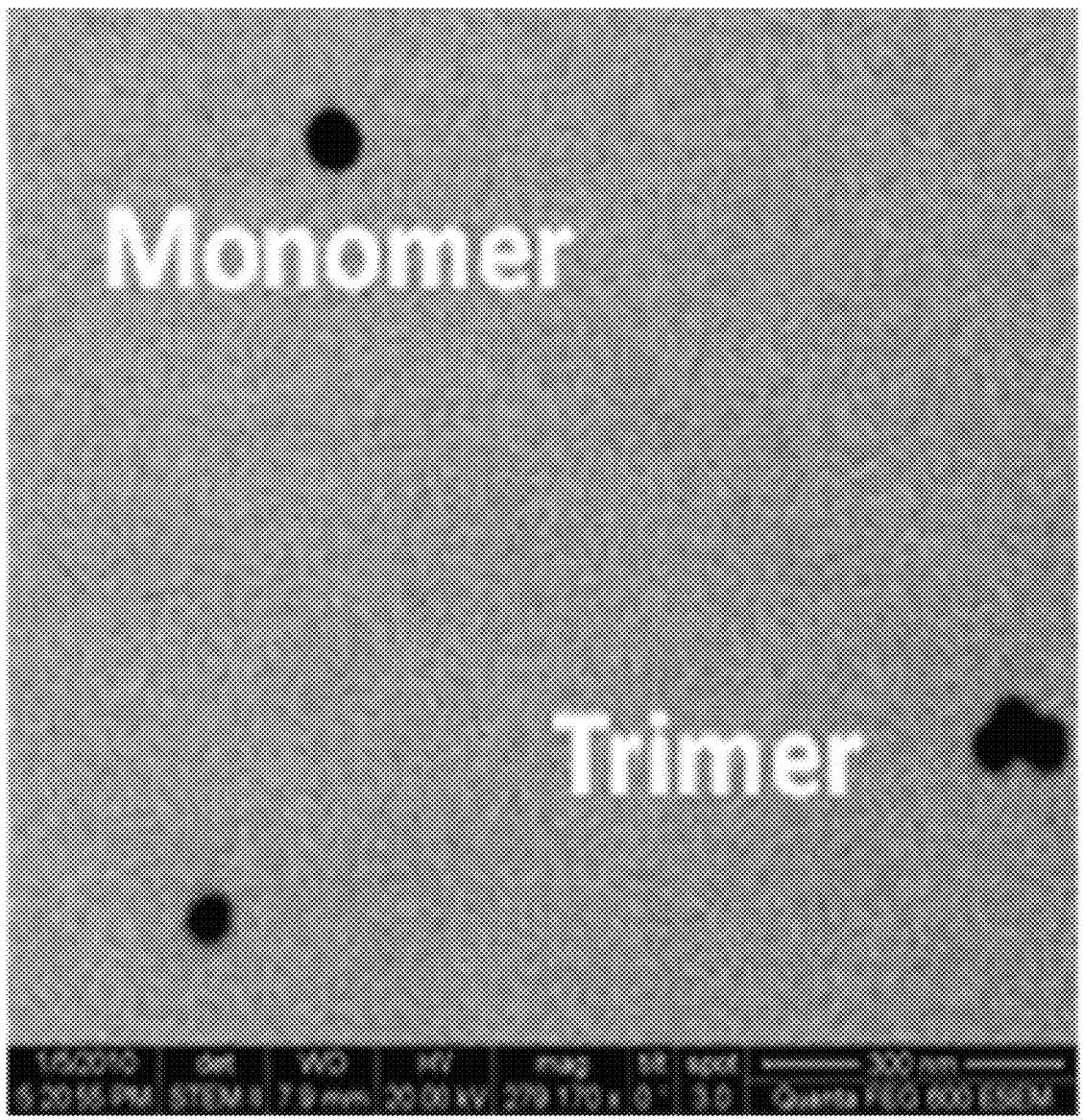
FIG. 3 illustrates STEM images of single 50 nm particles and of trimers. Acceleration voltage: 20 kV.

Initial experiments were carried out with a SEM/STEM. This is a scanning electron microscope equipped with a transmission mode detector. The SEM/STEM has a generous amount of space, allowing for the fabrication of a sample holder for the nanoaquarium. The SEM/STEM sample holder seals the inlet and outlet of the nanoaquarium with O-rings and is effective in preventing leakage into the high vacuum environment of the microscope chamber for the duration of an experiment (up to several hours). The SEM/STEM operates with relatively low acceleration voltage (≤30 kV) and provides good resolution for experiments with relatively large (>10 nm), high contrast samples (FIG. 3). The TEM/STEM offers greater acceleration voltage (≤300 kV); in some machines the space constraint is more stringent.

Provided here is an illustrative fabrication process for the nanoaquarium, which is depicted in FIG. 8. Two mating wafers are used to construct the nanoaquarium. One of these wafers is referred to for convenience as the bottom wafer and the other as the top wafer. The fabrication process starts with prime grade, double-sided polished, Si wafers with <100> orientation. One may deposit stoichiometric silicon nitride (~50 nm) by low pressure chemical vapor deposition (LPCVD) on both sides of the bottom and top wafers.

One may deposit an adhesion layer and pattern electrodes (gold or platinum) and/or heaters on the bottom wafer's topside by lift-off technique. When desired, the electrode pattern can be defined by the specific experiments to be conducted with the nanoaquarium. Next, one may deposit silicon oxide by plasma-enhanced, chemical vapor deposition (PECVD) on the bottom wafer's topside and polish the oxide coating with a chemical-mechanical polisher so that its surface is flat and smooth. The thickness of the silicon oxide layer determines the height of the imaging chamber. The silicon oxide also insulates the metallic path from the fluid chamber of the nanoaquarium. One may de-gas the silicon oxide by heating the wafer in a vacuum oven or nitrogen ambient at 300° C.-500° C. for several hours; this is optional, but can prevent outgassing from the silicon oxide during bond annealing, which can cause separation of the bonded wafers.

Next, one may pattern the silicon oxide layer on the top side of the bottom wafer using buffered oxide etch to define the imaging chambers, conduits, liquid storage chambers, and pneumatic chambers, and expose the electrodes at desired locations. The imaging chambers may optionally contain pillars, which may connect the chambers' floors to their ceilings. These connecting pillars prevent the thin silicon nitride membranes that may form the imaging chambers' floors and ceilings from bowing. One may then pattern the nitride on the back side of the bottom wafer in a reactive ion etcher (RIE) to form the pattern for the observation window, aligning the back side to the pattern that exists on the top side of the wafer.

Then, one may clean thoroughly both the bottom patterned wafer and the top unpatterned wafer with wet chemistries that include piranha (sulfuric acid and hydrogen peroxide) and RCA1 (ammonium hydroxide, hydrogen peroxide, and water). Next, one may activate with plasma the surfaces to be bonded and then bond the bottom, patterned wafer directly to the top, unpatterned one. See FIG. 1. The bonded wafers are annealed at 250° C. for 1-3 hours.

Next, one may pattern the nitride on the top side of the top (blank) wafer in a RIE so that the pattern for the observation windows on the top wafer is aligned with the pattern for the observation windows that already exists in the bottom (patterned) wafer. Using the patterned silicon nitride as a mask, one may etch the bonded wafer stack in KOH to define the inlets, outlets, imaging windows, and access to metal pads. Then, one removes nitride that remains in the inlets and outlets and covering the electrode pads.

As an alternative to the wafer bonding-based fabrication process, one may use another fabrication technique (FIG. 10) that utilizes a sacrificial layer for micro/nano-channel formation. See Youngcheol Joo; Kiet Dieu; Chang-Jin Kim; "Fabrication of monolithic microchannels for IC chip cooling," Micro Electro Mechanical Systems, 1995, MEMS '95, Proceedings. IEEE, vol., no., pp. 362, 29 Jan.-2 Feb. 1995. A Si wafer may be coated on both sides with a thin film (~50 nm) of silicon nitride or other suitable membrane material by LPCVD, PECVD, evaporation, or other thin film deposition technique. If desired, electrodes or optical waveguides can be deposited and patterned on the top side of the wafer. A sacrificial layer of a suitable material (such as amorphous silicon, silicon oxide, or a polymer) may be deposited to a thickness corresponding to the desired channel height (e.g., 100 nm thick) and patterned to define the nanochannel geometry. A conformal layer of another thin film (~50 nm) such as silicon nitride may be deposited on top of the wafer with the patterned sacrificial structure using an appropriate technique (e.g. PECVD, LPCVD, evaporation). The backside silicon nitride may be patterned to define the viewing window and the exposed silicon is etched in KOH. The topmost silicon nitride may be patterned and etched in a RIE to provide access to the sacrificial layer (e.g. amorphous silicon layer). The sacrificial layer may be etched using vapor phase etching (e.g. xenon difluoride for silicon or hydrofluoric acid for silicon oxide) to form the nanochannel. The access holes in the silicon nitride film may be plugged by depositing and patterning a layer of PECVD silicon oxide or another suitable film (e.g. polymer).

Figure 6:
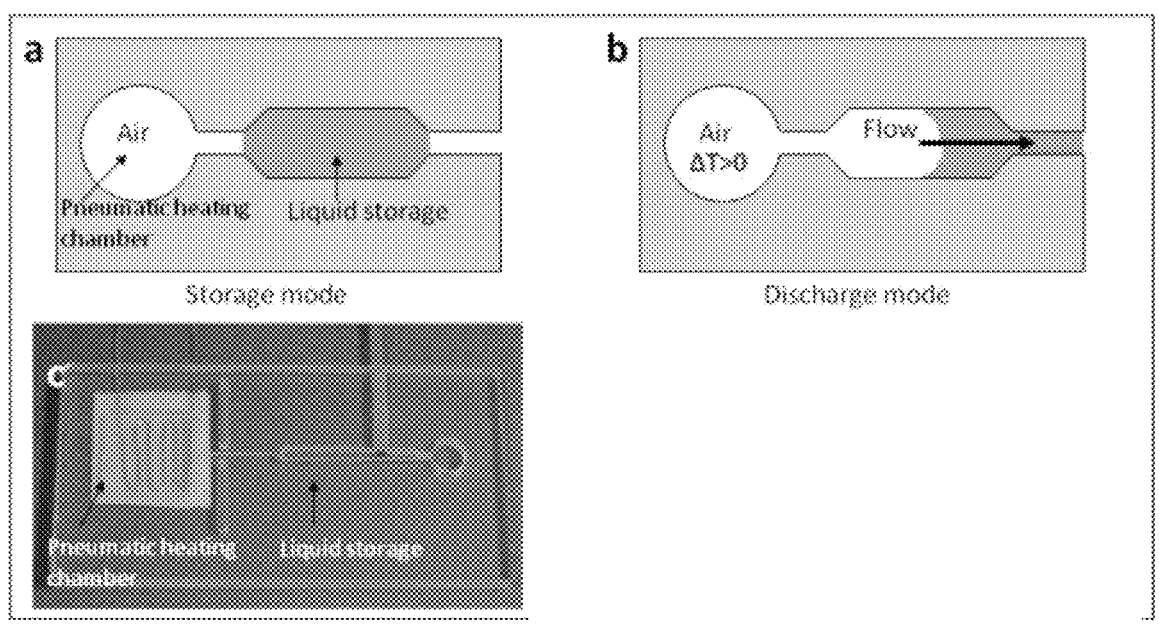
FIG. 6: (a), (b) Schematic illustration of a thermally actuated pneumatic microfluidic pump. When the gas chamber is heated, the gas expands and displaces the liquid from the storage chamber. If the gas is allowed to cool, the liquid can be sucked back to its storage chamber. (c) A prototype demonstrating thermally actuated pneumatic microfluidic pump.
Figure 9:
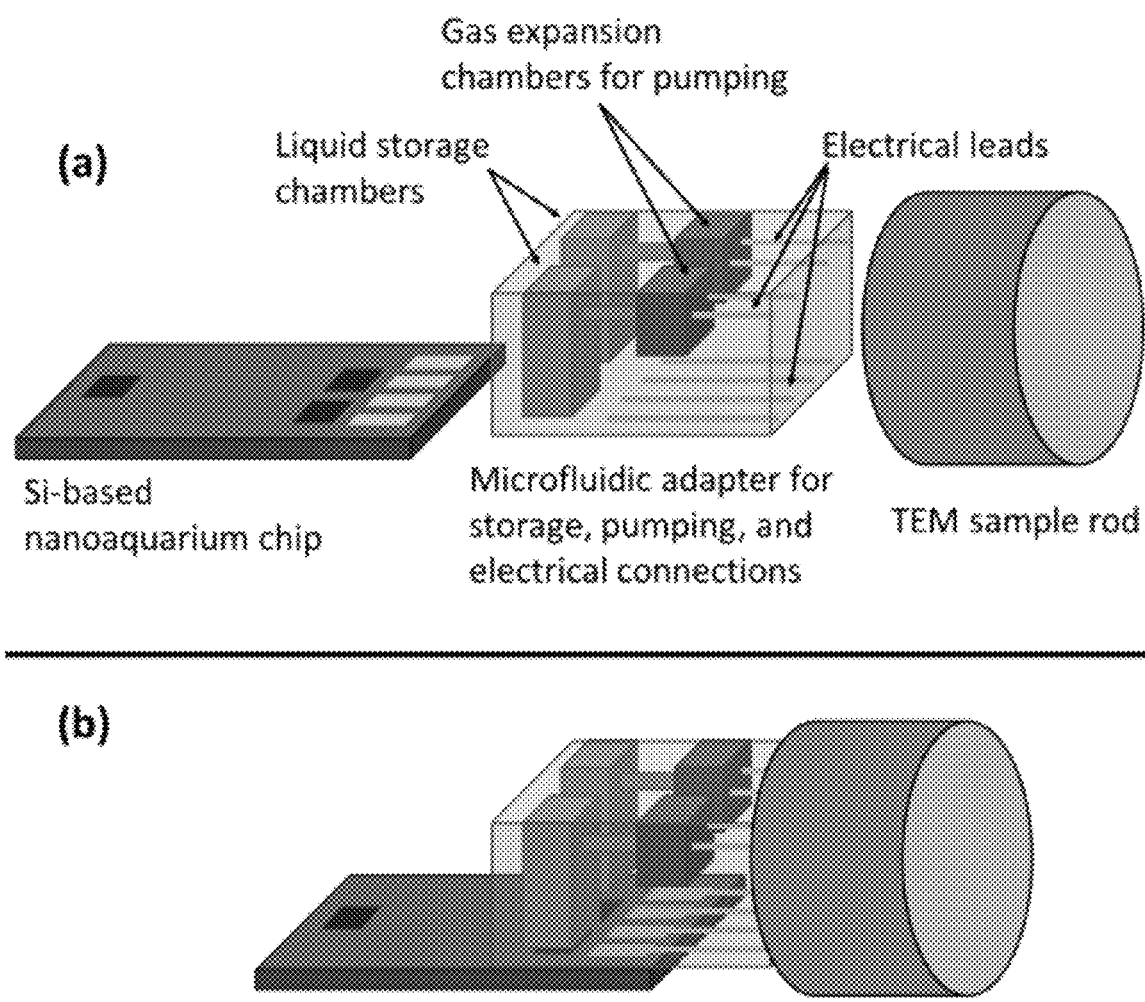
FIG. 9: Conceptual illustration of a microfluidic adapter that interfaces a nanoaquarium to a TEM sample rod. The adapter may feature sample storage, pumping, and electrical connections. (a) Exploded view. (b) Assembled view.

The nanoaquarium may include on-chip storage and pumping of various solutions and chemicals, or that function may be performed by a secondary cassette that interfaces with the nanoaquarium as in FIG. 9. The nanoaquarium may include on-chip storage and pumping of various solutions and chemicals. The storage chambers may contain constrictions at their downstream ends that may serve as passive valves. When filled by capillary forces, the liquid may migrate until it reaches the constriction and then stop. The upstream ends of the storage conduits may be connected to air-containing, pneumatic chambers equipped with resistance heaters. A pneumatic heating chamber can be, as described elsewhere herein, on a base or holder as well as the chip. Such a configuration offers all of the benefits described herein. Upon heating, the gas may expand and displace the storage conduit's liquid contents into the imaging chamber; an exemplary such element is shown in FIG. 6, and the assembly is shown in exemplary FIG. 9. This method allows one to minimize the volume of liquid needed for the experiments and, most importantly, avoid the need for hydraulic connections through the sample holder. This distinction addresses one of the major shortcomings of many commercial in-situ liquid cells in which the liquid is supplied from the outside and comes in contact with the sample holder. Such an arrangement may be vulnerable to contamination, corrosion, short circuits when performing electrochemical and electrokinetic experiments, and the possibility of relatively large amount of liquid entering the vacuum chamber should leakage occur. In contrast, the disclosed design features fully enclosed reservoirs that are isolated from the sample holder. All connections to the sample holder may be electrical, and the nanoaquarium plus holder can easily be tested before loading into the microscope. If desired, the imaging chamber can also be equipped with electrodes to induce AC-electroosmosis to stir the various flow streams.

FIG. 7 depicts one illustrative variant of the nanoaquarium consisting of four channels that meet at a cross intersection. This four port version allows for multiple streams to be either mixed in-situ or to form interfaces, along with multiple viewing windows for observation of the mixture at various locations downstream. Windows are suitably transparent (or at least partially transparent) to electrons of certain energies, so as to allow for SEM/TEM/STEM analysis. Windows may also be optically transparent. Experiments can be carried out either in stationary mode or in flow mode. Since the fabrication technique utilizes photolithography, one may have a great amount of flexibility in designing the conduits' layout. Electrodes for electrical sensing and actuation, as well as electrodes for in-situ resistive heating, may be included in the four port version. The resistance of the resistors, which is suitably electrically insulated from the solution in the flow cell, is calibrated in a temperature-controlled oven as a function of temperature.

It should be understood that the windows may be square in conformation, although square windows are not required. A window may have a dimension (e.g., length, width) in the range of from about 1 micrometer to about 100 micrometers, or even about 200 micrometers. A window may be circular in cross-section.

The TEM sample holder is another part of the instrumentation since it provides the means to control the experiment within the nanoaquarium. A TEM holder suitably has the same outer dimensions as a standard single-tilt holder, but can be modified to allow the sealing of the fluid inlets/outlets/chambers with plastic/rubber gaskets and electrical connections to enable external control for in-situ actuation. For electrochemical experiments and experiments involving field-assisted nanoparticle assembly, these connections allow control of the electrodes' voltage or current. For experiments that include fluid motion, the connections enable actuation of the pneumatic system described above. For experiments that include heating, the electrical connections connect to the resistor heaters in the nanoaquarium.

In summary, the present disclosure provides fluid cells having chambers with a height that can be in the range of tens to hundreds of nanometers. The thickness may be chosen to minimize scattering by the liquid while allowing the process of interest to be observed; the optimal thickness will depend on the accelerating voltage and on materials and processes to be studied. The devices also provide a hermetic seal against the environment. The devices also include embedded electrodes and electrical connections between the nanoaquarium's interior and the sample holder. The devices may feature on-board storage of fluids and integrated pumping utilizing lab on chip technology, as well as the ability to interface or mix multiple flow streams in-situ and initiate in-situ reactions.

Further background is found in "The Nanoaquarium: A Platform for In situ Transmission Electron Microscopy in Liquid Media," *J. of Micromechanical Systems*, Vol. 19, No. 4 (2010); "In situ liquid-cell electron microscopy of colloid aggregation and growth dynamics," *Phys Review E* 83, 061405 (2011); and "The nanoaquarium: A nanofluidic platform for in situ transmission electron microscopy in liquid media," *Dissertation to the University of Pennsylvania Dept. of Mechanical Engineering and Applied Mathematics* (2011), the entireties of which references are incorporated herein by reference.

What is claimed:

1. A device, comprising:
a chamber defined by upper and lower membranes, the chamber having a height in the range of from about 10 nm to less than about 6 μm;
at least one pillar disposed between the upper and lower membranes, the pillar comprising a cross-sectional dimension in the range of from about 0.1 μm to about 50 μm, the at least one pillar being configured to strengthen, stiffen, or strengthen and stiffen the upper and lower membranes so as to reduce membrane deflection;
a first inlet and a second inlet;
at least one outlet in fluid communication with the chamber;
a first viewing window in fluid communication with the chamber;
a second viewing window in fluid communication with both the chamber and the first viewing window; and
two or more electrodes disposed within the chamber, each of the electrodes including a coating,
wherein the first inlet and the second inlet converge with each other at at least one of the first viewing window and the second viewing window.

2. The device of claim 1, further comprising (a) a pump in fluid communication with the chamber, (b) a storage vessel in fluid communication with the chamber, or both (a) and (b).

3. The device of claim 1, wherein the upper membrane, the lower membrane, or both, is surmounted by a support layer, the upper and lower layers having upper and lower apertures formed respectively thereon, the apertures in register with at least a portion of the chamber and with one another.

4. The device of claim 1, further comprising at least one fluid storage reservoir capable of fluid communication with the chamber.

5. The device of claim 4, wherein the fluid storage reservoir is in fluid communication with a gas reservoir, the fluid storage and gas storage reservoirs being configured such that expansion of gas in the gas storage reservoir displaces fluid from the fluid storage reservoir.

6. The device of claim 1, wherein the upper membrane, the lower membrane, or both, has a thickness in the range of from about 5 nm to about 100 nm.

7. The device of claim 1, wherein the upper aperture, the lower aperture, or both, have a cross-sectional dimension in the range of from about 100 nm to about 1 millimeter.

8. The device of claim 1, further comprising a third inlet.

9. The device of claim 1, wherein the height is in the range of from about 10 nm to less than about 1 μm.

10. The device of claim 1, wherein the coating comprises silicon oxide.

11. The device of claim 1, further comprising an on-board pump.

12. The device of claim 1, wherein both of the first and second viewing windows are configured to expose either of the upper or lower membranes.

13. A system, comprising:
an imaging chamber defined by upper and lower membranes, the chamber having a height in the range of from about 10 nm to less than about 1 μm;
at least one pillar disposed between the upper and lower membranes, the pillar comprising a cross-sectional dimension in the range of from about 0.1 μm to about 50 μm, the at least one pillar being configured to strengthen, stiffen, or strengthen and stiffen the upper and lower membranes so as to reduce membrane deflection;
a first inlet and a second inlet that converge with each other at the imaging chamber;
at least one outlet in fluid communication with the imaging chamber;
two or more electrodes disposed within the imaging chamber, each of the electrodes including a coating; and
a microfluidic adapter in fluid communication with the imaging chamber, the microfluidic adapter comprising:
at least one liquid storage chamber; and
at least one pneumatic heating chamber in fluid communication with the at least one liquid storage chamber, the pneumatic heating chamber being configured such that expansion of a gas within the pneumatic heating chamber exerts a liquid stored within the at least one liquid storage chamber into the imaging chamber.

14. The system of claim 13, wherein the at least one pneumatic heating chamber further comprises at least one resistance heater.

15. The system of claim 13, wherein the at least one liquid storage chamber further comprises at least one constriction positioned at a downstream end of the liquid storage chamber, wherein the at least one constriction serves as a passive valve.

16. The system of claim 13, further comprising:
a first viewing window in fluid communication with the imaging chamber; and
a second viewing window in fluid communication with both the imaging chamber and the first viewing window.

17. The system of claim 13, wherein the coating comprises silicon oxide.

18. The system of claim 13, further comprising an on-board pump.

* * * * *